(12) United States Patent
Sone

(10) Patent No.: US 11,205,878 B2
(45) Date of Patent: Dec. 21, 2021

(54) DEVICE WITH CONNECTOR

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Kosuke Sone, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/979,557

(22) PCT Filed: Mar. 7, 2019

(86) PCT No.: PCT/JP2019/009055
§ 371 (c)(1),
(2) Date: Sep. 10, 2020

(87) PCT Pub. No.: WO2019/181530
PCT Pub. Date: Sep. 26, 2019

(65) Prior Publication Data
US 2021/0006016 A1 Jan. 7, 2021

(30) Foreign Application Priority Data
Mar. 22, 2018 (JP) .............................. JP2018-054477

(51) Int. Cl.
*H01R 13/6581* (2011.01)
*F16K 31/06* (2006.01)
(Continued)

(52) U.S. Cl.
CPC ..... *H01R 13/6581* (2013.01); *F16K 31/0675* (2013.01); *H01R 13/73* (2013.01); *H01F 7/081* (2013.01)

(58) Field of Classification Search
CPC ....... H01R 13/648; H01R 13/73; H01F 7/081; F16K 31/0675
(Continued)

(56) References Cited

U.S. PATENT DOCUMENTS 5,508,671 A * 4/1996 Takashi ................. F16D 27/112
335/296
5,830,000 A * 11/1998 Shifflett ............. H01R 13/6272
439/352

(Continued)

FOREIGN PATENT DOCUMENTS

JP   H03-008405 U   1/1991
JP   2017-089763 A   5/2017

OTHER PUBLICATIONS

International Search Report dated May 21, 2019 for WO 2019/181530 A1 (4 pages).

*Primary Examiner* — Peter G Leigh
(74) *Attorney, Agent, or Firm* — Abelman, Frayne & Schwab

(57) ABSTRACT

A solenoid is provided with a valve body having a cylindrical shape extending along a front-rear direction, and a device connector including leg portions projecting outward from a side wall of the valve body and a connector housing provided on sides of the leg portions opposite to the valve body with a clearance provided between the side wall of the valve body and the connector housing, and a magnetic shield member made of metal, to be mounted outside the valve body and having a tubular shape open on one end part. The magnetic shield member includes avoidance recesses formed into a concave shape from an opening end to avoid (Continued)

interference with the leg portions and an inserting portion to be inserted into the clearance between the side wall of the valve body and the housing.

5 Claims, 14 Drawing Sheets

(51) Int. Cl.
*H01R 13/73* (2006.01)
*H01F 7/08* (2006.01)

(58) Field of Classification Search
USPC .............................................. 439/607.01, 41
See application file for complete search history.

(56) References Cited

U.S. PATENT DOCUMENTS

| | | | | |
|---|---|---|---|---|
| 6,512,440 B2* | 1/2003 | Suda | ................. | H01F 5/04 336/107 |
| 7,138,895 B2* | 11/2006 | Chung | ................. | F16D 27/112 335/299 |
| 7,224,253 B2* | 5/2007 | Chung | ................. | H01F 7/06 335/299 |
| 7,746,204 B2* | 6/2010 | Oh | ................. | F16D 27/14 335/299 |
| 7,772,946 B2* | 8/2010 | Oh | ................. | H01R 13/6666 335/219 |
| 7,823,280 B2* | 11/2010 | Chung | ................. | H01R 13/112 29/856 |
| 8,013,705 B2* | 9/2011 | Oh | ................. | F16D 27/14 336/107 |
| 8,610,527 B2* | 12/2013 | Oh | ................. | F16D 27/112 336/192 |
| 8,648,682 B2* | 2/2014 | Malagoli | ................. | H01F 27/04 335/299 |
| 9,614,317 B2* | 4/2017 | Yoshigi | ................. | H01R 13/516 |
| 9,666,983 B2* | 5/2017 | Kitamura | ................. | H01R 13/64 |
| 9,819,123 B2* | 11/2017 | Sone | ................. | F16H 61/0006 |
| 9,829,206 B2* | 11/2017 | Chen | ................. | G01K 1/14 |
| 9,905,970 B2* | 2/2018 | Sone | ................. | H01R 13/64 |
| 9,963,093 B2* | 5/2018 | Sone | ................. | H01R 24/005 |
| 10,069,286 B2* | 9/2018 | Sone | ................. | B60R 16/0215 |
| 10,326,232 B2* | 6/2019 | Sone | ................. | H01R 13/639 |
| 2002/0175791 A1* | 11/2002 | LaMarca | ................. | H01F 7/128 335/220 |
| 2003/0114020 A1* | 6/2003 | Zhang | ................. | H01R 13/648 439/41 |
| 2018/0316129 A1* | 11/2018 | Sone | ................. | H01R 13/629 |

\* cited by examiner

DEVICE WITH CONNECTOR

CROSS REFERENCE TO RELATED APPLICATIONS

This application is a national phase of PCT application No. PCT/JP2019/009055, filed on 7 Mar. 2019, which claims priority from Japanese patent application No. 2018-054477, filed on 22 Mar. 2018, all of which are incorporated herein by reference.

TECHNICAL FIELD

A technique disclosed in this specification relates to a device with connector to be mounted on a device.

BACKGROUND

Conventionally, a device connector used by being mounted on a device disposed in an automatic transmission of a vehicle is described, for example, in Patent Document 1.

In this technique, a connector housing projects on the outer peripheral surface of a tubular device. The connector housing includes a receptacle, and a terminal electrically connected to the device is disposed to project into the receptacle. The above device is, for example, a solenoid having a coil disposed inside.

PRIOR ART DOCUMENT

Patent Document

Patent Document 1: JP 2016-81727A

SUMMARY OF THE INVENTION

Problems to be Solved

If it is tried to improve the magnetic field efficiency of the device in the above device connector, it is considered to cover around the device with a magnetic shield member made of a metal material. However, according to the above configuration, the magnetic shield member cannot be disposed in a part of the device where the connector housing is provided. Thus, there has been a problem that it is difficult to sufficiently improve the magnetic field efficiency.

The technique disclosed in this specification was completed on the basis of the above situation and aims to provide a device with connector having an improved magnetic field efficiency.

Means to Solve the Problem

The technique disclosed in this specification is directed to a device with connector including a device having a cylindrical shape extending along an axial direction, a device connector including a leg portion projecting outward from a side wall of the device and a connector housing provided on a side of the leg portion opposite to the device with a clearance provided between the side wall of the device and the connector housing, and a magnetic shield member made of metal, to be mounted outside the device and having a tubular shape open on one end part, the magnetic shield member including an avoidance recess formed into a concave shape from an opening end of the one end part to avoid interference with the leg portion and an inserting portion to be inserted into the clearance between the side wall of the device and the connector housing.

According to the above configuration, the clearance is provided between the device and the connector housing by the leg portion projecting from the side wall of the device. Since the inserting portion of the magnetic shield member is inserted into this clearance, a region of the device covered by the magnetic shield member is wider as compared to the case where the connector housing is directly provided on the side wall of the device. As a result, the magnetic field efficiency of the device can be improved.

Further, according to the above configuration, a part of the device not covered by the magnetic shield member is a region of the magnetic shield member where the avoidance recess for avoiding interference with the leg portion is provided. As a result, the part not covered by the magnetic shield member can be made smaller as compared to the case where the connector housing is directly provided on the side wall of the device, wherefore the magnetic field efficiency of the device can be improved.

The following modes are preferable as embodiments of the technique disclosed in this specification.

The device includes a front wall located on a front side and a rear wall located on a rear side with respect to the axial direction, the magnetic shield member includes a front shield portion extending along the front wall of the device and a side shield portion extending along the side wall of the device, an end part of the side shield portion is formed into a first bent portion bent along the rear wall and connected to the side shield portion, and an end part of the inserting portion is formed into a second bent portion bent along the rear wall.

According to the above configuration, the rear wall of the device is at least partially covered by the first and second bent portions. In this way, the front shield portion, the side shield portion, the first bent portion and the second bent portion of the magnetic shield member are electromagnetically connected, wherefore the magnetic field efficiency of the device can be further improved.

A plurality of terminals are disposed in the connector housing and connected to the device while being disposed inside the leg portion.

According to the above configuration, the device and the device connector can be electrically connected with the plurality of terminals electrically insulated.

A plurality of terminals and a lock portion for locking a mating connector are disposed side by side along an outer peripheral surface of the side wall of the device in the connector housing.

According to the above configuration, since a locking portion of the device connector and the mating connector is disposed side by side with the plurality of terminals along the outer peripheral surface of the side wall of the device, a height can be reduced as compared to the case where the lock portion is provided above the terminals.

The lock portion is made of insulating synthetic resin and disposed between the plurality of terminals.

According to the above configuration, since the insulating lock portion is disposed between the terminals, a short circuit can be more reliably prevented while a clearance between the terminals is effectively utilized.

Effect of the Invention

According to the technique disclosed in this specification, it is possible to improve the magnetic field efficiency of the device with connector.

DETAILED DESCRIPTION TO EXECUTE THE INVENTION

First Embodiment

Figure 1:
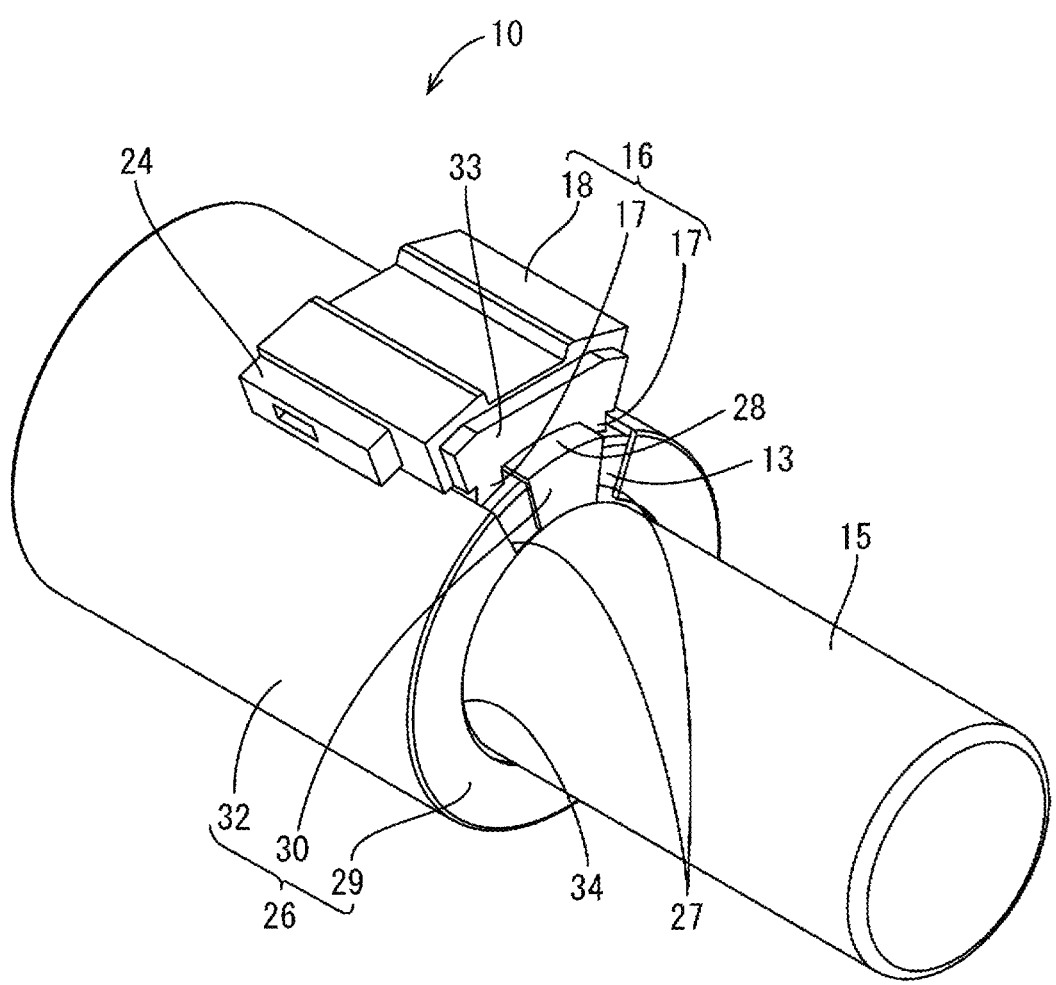
FIG. 1 is a perspective view showing a solenoid according to a first embodiment.

A first embodiment in which the technique disclosed in this specification is applied to a solenoid 10 (an example of a device with connector) disposed inside an automatic transmission (not shown) installed in a vehicle (not shown) is described with reference to FIGS. 1 to 8. In the following description, a Z direction is referred to as an upward direction, a Y direction is referred to as a forward direction and an X direction is referred to as a leftward direction.

(Valve Body 11)

A valve body 11 (an example of a device) has a cylindrical shape extending in a front-rear direction (an example of an axial direction). A front wall 12 is provided on a front end part of the valve body 11, and a rear wall 13 is provided on a rear end part of the valve body 11. A side wall 14 of the valve body 11 is orthogonal to the front wall 12 and the rear wall 13.

An unillustrated coil is accommodated inside the valve body 11. A valve portion 15 projecting rearward is provided on the rear wall 13 of the valve body 11. The valve portion 15 has a cylindrical shape having a smaller diameter than the valve body 11.

(Device Connector 16)

A device connector 16 is provided to project upward from a position near a rear end part on the side wall 14 of the valve body 11. The device connector 16 includes a plurality of (two in this embodiment) leg portions 17 projecting radially outward of the valve body 11 from the side wall 14 of the valve body 11 while being spaced apart in a circumferential direction of the valve body 11. A connector housing 18 is integrally formed to the leg portions 17 on end parts of the leg portions 17 opposite to the valve body 11. The leg portions 17 and the connector housing 18 are formed by injection molding of insulating synthetic resin. A clearance 19 is formed between the side wall 14 of the valve body 11 and the connector housing 18 by the leg portions 17.

The connector housing 18 includes an opening 20 open forward. A plurality of (two in this embodiment) terminals 21 are disposed inside the opening 20. Parts of the terminals 21 disposed in the opening 20 are formed into a tab shape extending forward. The terminal 21 is made of conductive metal and bar-like. An arbitrary metal such as copper or copper alloy can be appropriately selected according to need as the metal constituting the terminal 21. A plating layer made of metal such as tin or nickel may be formed on the surface of the terminal 21.

A rear end part of the terminal 21 is embedded in a rear wall 33 of the connector housing 18. Although not shown in detail, the rear end part of the terminal 21 is embedded inside the leg portion 17 while being bent at a right angle radially inward of the valve body 11, and electrically connected to the coil in the valve body 11.

A mating connector 23 is fit into the opening 20 of the connector housing 18 from front. The mating connector 23 is connected to ends of unillustrated wires. Unillustrated female terminals are accommodated inside the mating connector 23. The female terminals and the wires are electrically connected by a known method such as crimping.

A lock portion 24 projecting leftward is formed on a left end part of the connector housing 18. This lock portion 24 and a lock receiving portion 25 formed at a position of the mating connector 23 corresponding to the lock portion 24 are resiliently locked, whereby the mating connector 23 fit into the opening 20 of the connector housing 18 is retained and held. With the mating connector 23 fit in the connector housing 18, the tab-like terminals 21 of the device connector 16 and the female terminals of the mating connector 23 are electrically connected.

Figure 2:
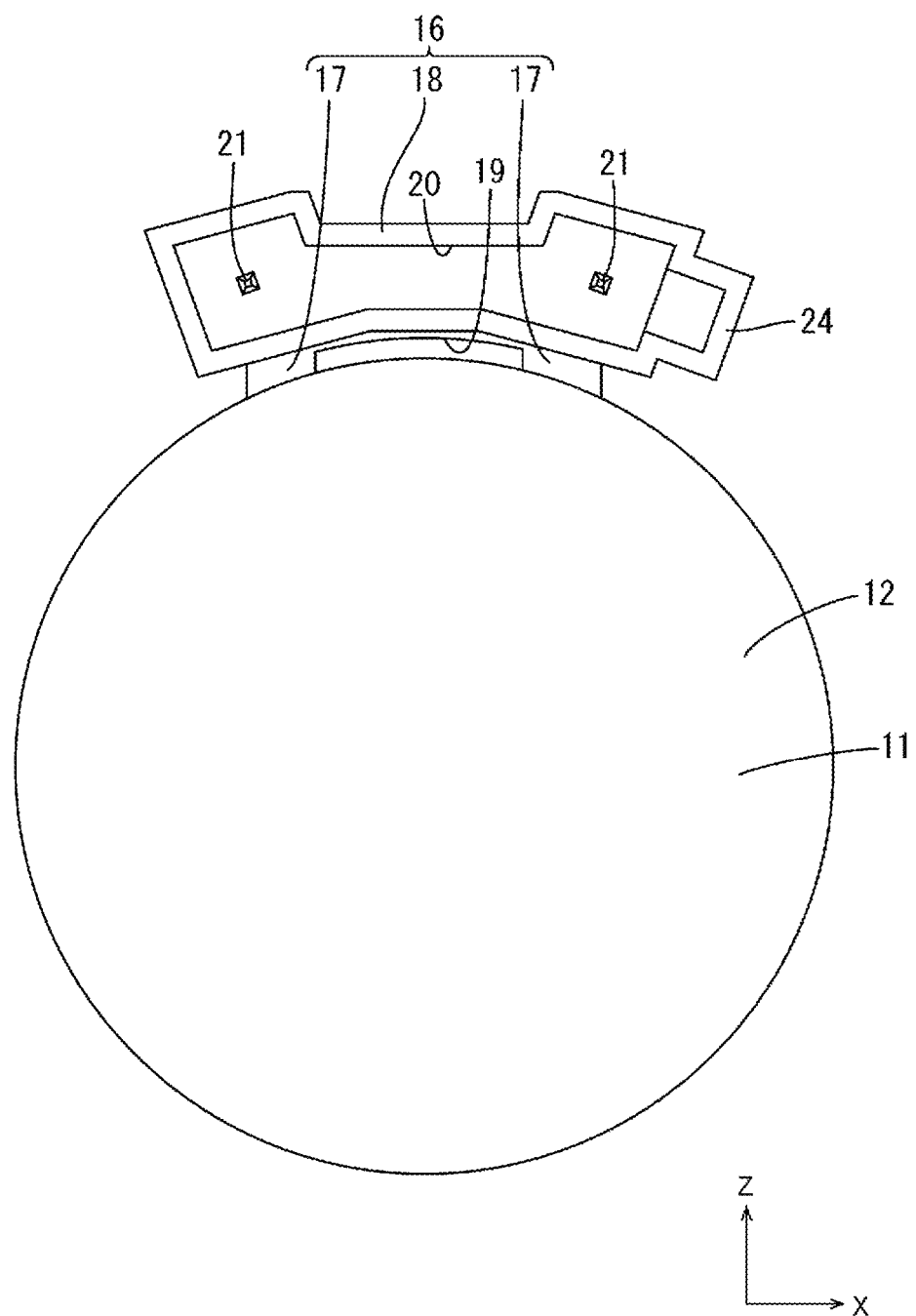
FIG. 2 is a front view showing a valve body and a device connector with a magnetic shield member removed.
Figure 3:
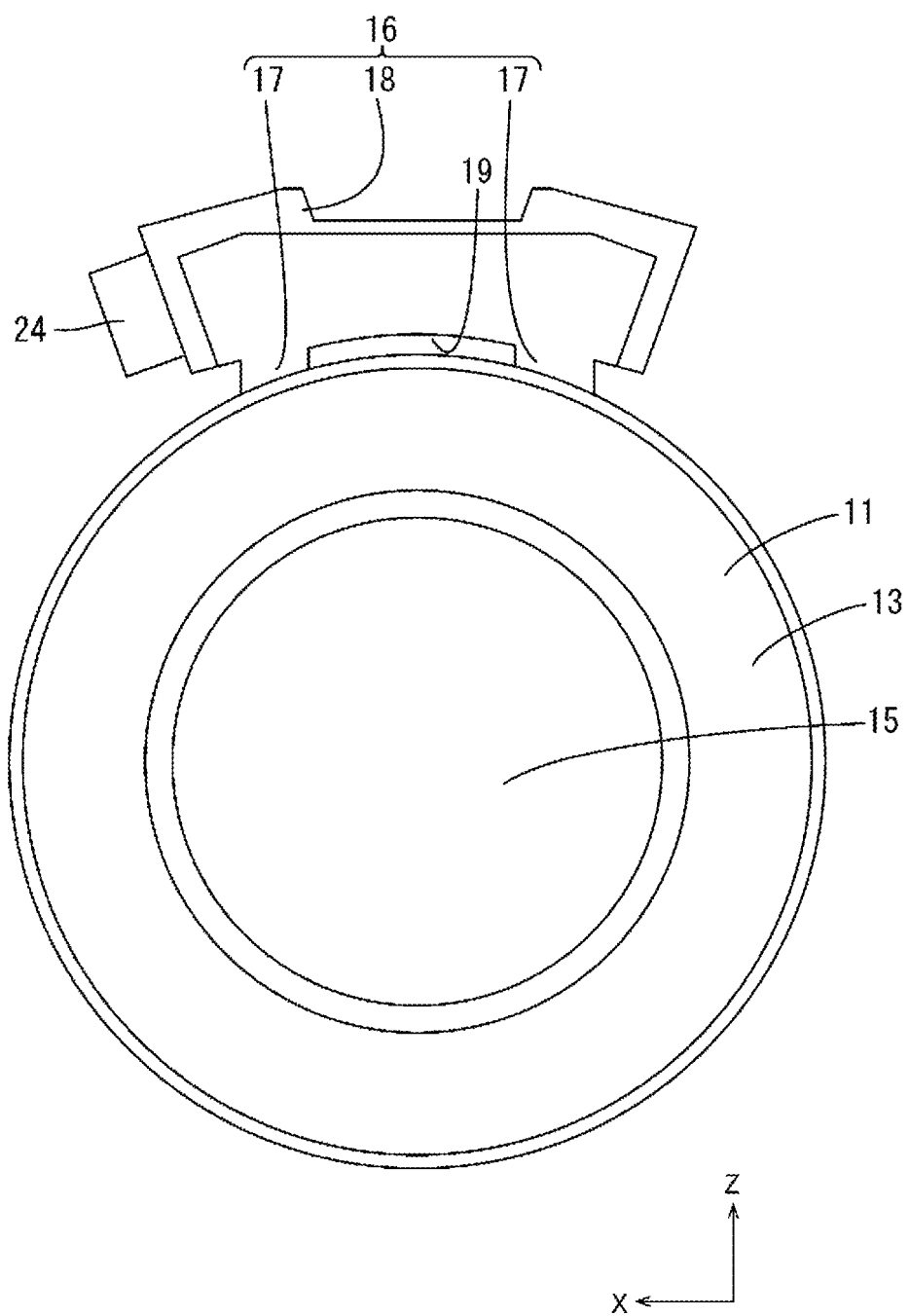
FIG. 3 is a back view showing the valve body and the device connector with the magnetic shield member removed.
Figure 4:
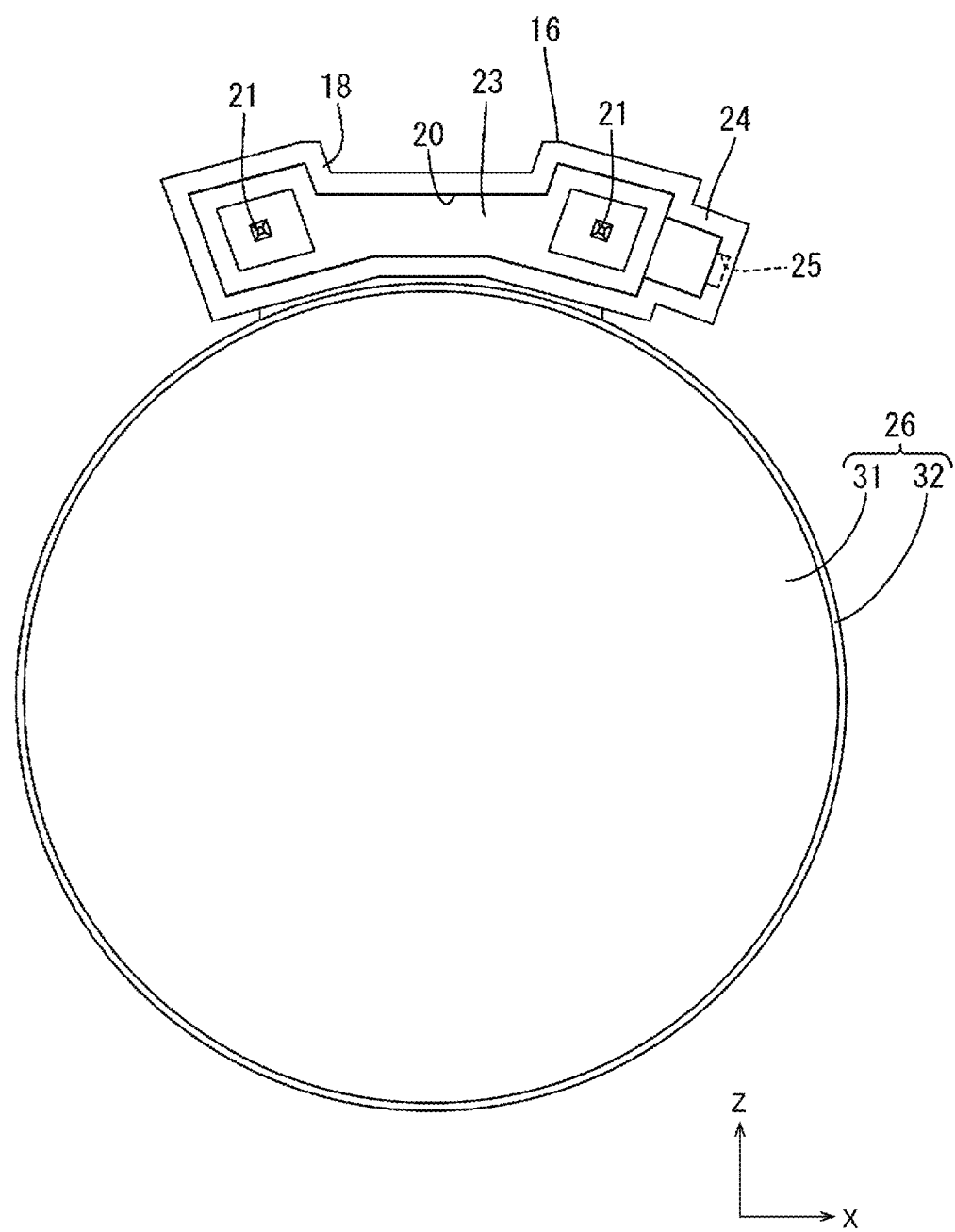
FIG. 4 is a perspective view showing a mating connector.
Figure 5:
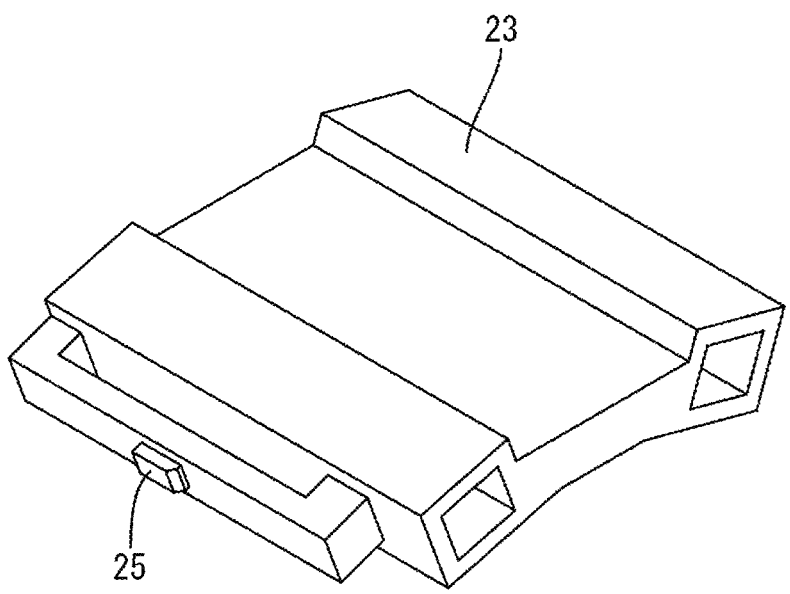
FIG. 5 is a front view showing the solenoid in a state where the mating connector is connected to the device connector.
Figure 6:
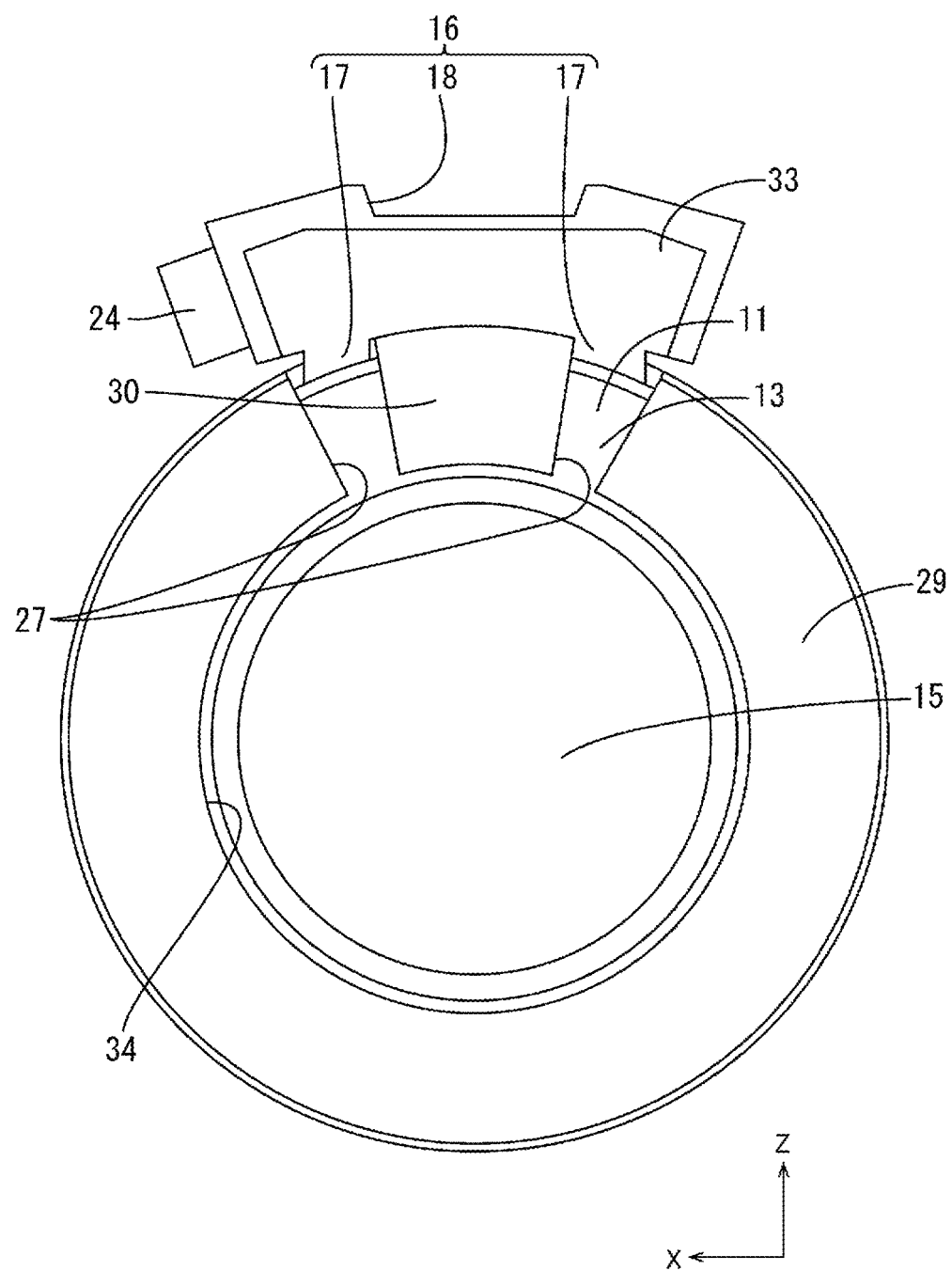
FIG. 6 is a back view showing the solenoid.
Figure 7:
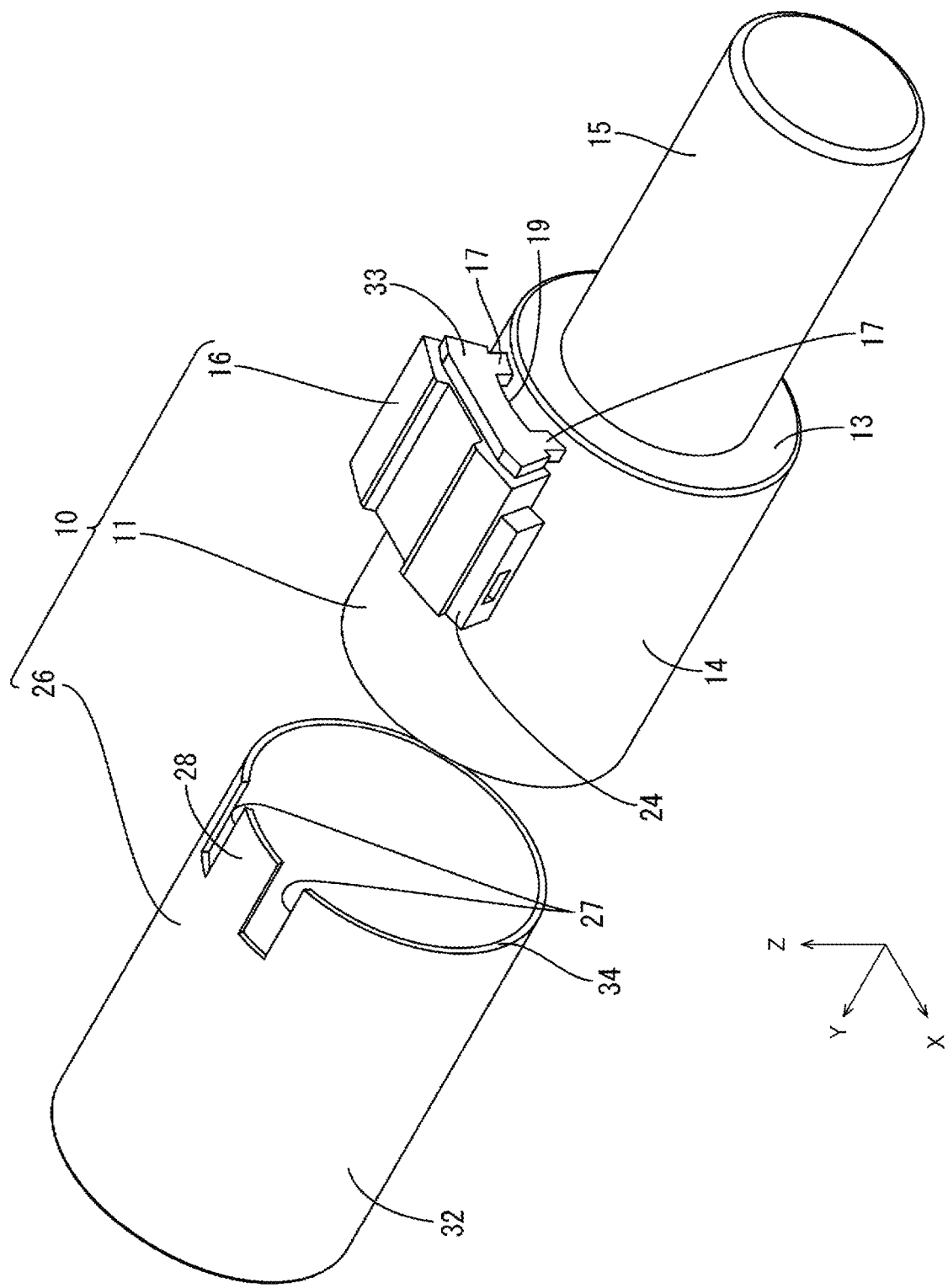
FIG. 7 is an exploded perspective view showing the solenoid.
Figure 8:
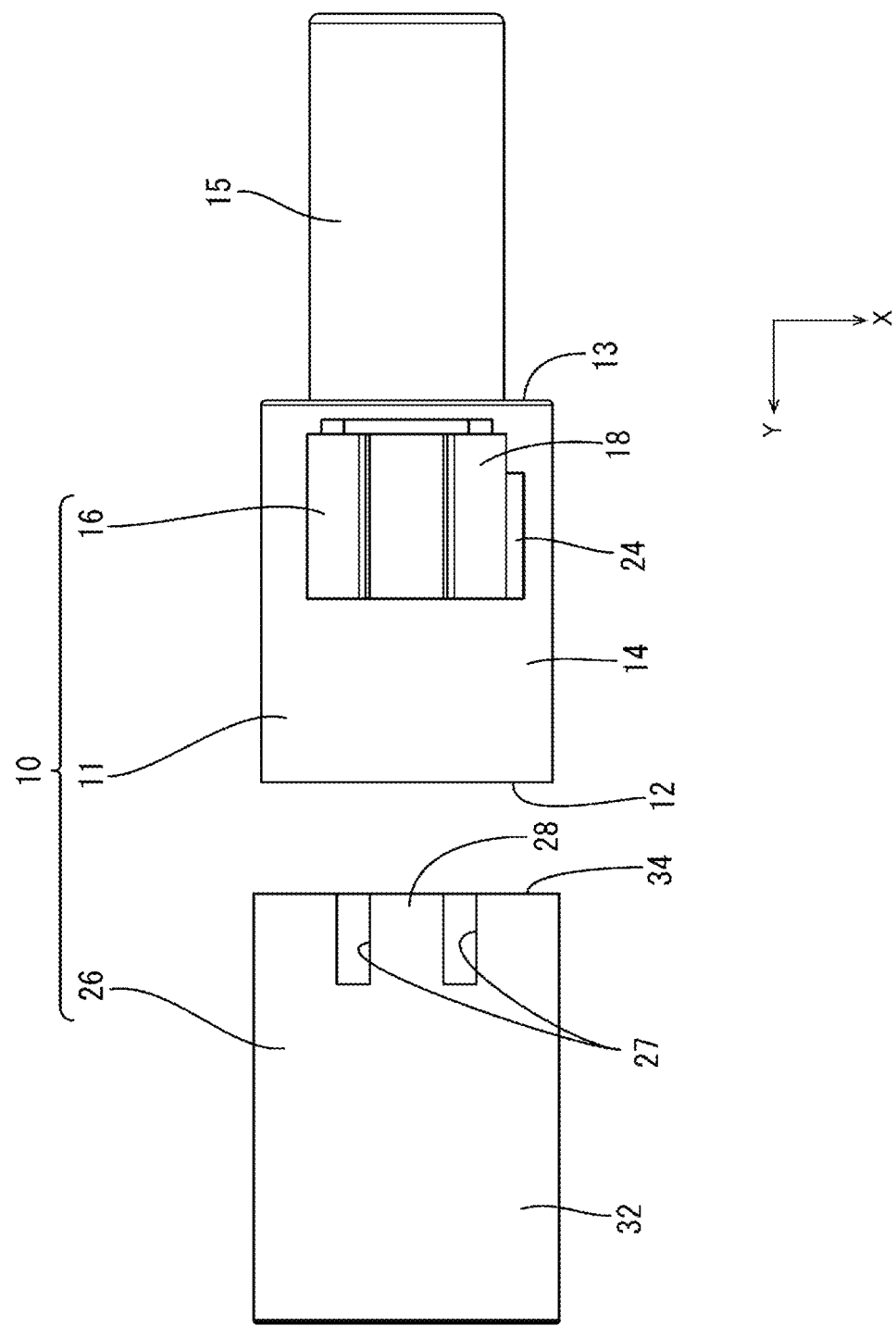
FIG. 8 is an exploded plan view showing the solenoid.

As shown in FIG. 2, in the device connector 16, the lock portion 24 and front end parts of the two terminals 21 are disposed side by side along the outer peripheral surface of the side wall 14 of the valve body 11 while being spaced apart along the circumferential direction of the valve body 11.

(Magnetic Shield Member 26)

A magnetic shield member 26 made of metal is mounted outside the valve body 11 from front. An arbitrary metal such as copper, copper alloy, iron or iron alloy can be appropriately selected according to need as the metal constituting the magnetic shield member 26.

The magnetic shield member 26 is formed into a cylindrical shape extending in the front-rear direction and having a closed front side and an open rear side. An inner diameter of the magnetic shield member 26 is set substantially equal to an outer diameter of the valve body 11. A plurality of (two in this embodiment) avoidance recesses 27 concave forward are provided in an opening end 34 of the magnetic shield member 26. The avoidance recesses 27 are provided at positions corresponding to the leg portions 17 of the device connector 16 with the magnetic shield member 26 externally fit on the valve body 11. Lateral widths of the avoidance recesses 27 are set equal to or somewhat larger than those of the leg portions 17. In this way, the leg portions 17 of the device connector 16 and the magnetic shield member 26 do not interfere with each other with the magnetic shield member 26 externally fit on the valve body 11.

An inserting portion 28 to be inserted into the clearance 19 formed between the side wall 14 of the valve body 11 and the connector housing 18 is formed to project rearward between the two avoidance recesses 27 on a rear end part of the magnetic shield member 26. The rear end edge of the inserting portion 28 is set substantially at the same position as the rear end edge of a later-described side shield portion 32 of the magnetic shield member 26 in the front-rear direction.

A region of the side shield portion 32 of the magnetic shield member 26 near the opening end 34 is formed into a first bent portion 29 bent radially inward of the valve body 11 and extending along the rear wall 13 of the valve body 11. A rear end part of the inserting portion 28 of the magnetic shield member 26 is formed into a second bent portion 30 bent radially inward of the valve body 11 and extending along the rear wall 13 of the valve body 11. The lower end edge of the first bent portion 29 and that of the second bent portion 30 are set at such positions as not to interfere with the valve portion 15.

The magnetic shield member 26 includes a front shield portion 31 located forward of the front wall 12 of the valve body 11 and the side shield portion 32 covering the side wall 14 of the valve body 11 from a radially outer side of the valve body 11 with the magnetic shield member 26 external fit on the valve body 11. The first bent portion 29 is bent along the rear wall 13 of the valve body 11 and connected to the side shield portion 32.

The entire region of the front wall 12 of the valve body 11 is covered by the front shield portion 31. The side wall 14 of the valve body 11 is covered by the side shield portion 32 except in regions corresponding to the avoidance recesses 27 of the magnetic shield member 26. The side wall 14 of the valve body 11 is exposed to outside in regions of the magnetic shield member 26 where the avoidance recesses 27 are provided. The rear wall 13 of the valve body 11 is partially covered by the first and second bent portions 29, 30 of the magnetic shield member 26.

By the above configuration, a front part of the valve body 11 is magnetically shielded by the front shield portion 31, a side part of the valve body 11 is magnetically shielded by the side shield portion 32 except in the regions corresponding to the avoidance recesses 27, and a rear part of the valve body 11 is magnetically shielded in regions corresponding to the first and second bent portions 29, 30.

(Manufacturing Process of Embodiment)

Next, an example of a manufacturing process of the solenoid 10 according to this embodiment is described. Note that the manufacturing process of the solenoid 10 is not limited to that described below.

After the terminals 21 are connected to the coil, the device connector 16 is integrally formed to the valve body 11 by insert molding of insulating synthetic resin. A metal plate material is pressed into a predetermined shape, thereby forming the magnetic shield member 26.

The magnetic shield member 26 is externally fit on the valve body 11 from front. At this time, the leg portions 17 are disposed inside the avoidance recesses 27 of the magnetic shield member 26. Further, the inserting portion 28 of the magnetic shield member 26 is inserted into the clearance 19 between the side wall 14 of the valve body 11 and the connector housing 18.

Subsequently, the rear end edge of the magnetic shield member 26 is bent radially inward of the valve body 11, thereby forming the first bent portion 29. The rear end edge of the inserting portion 28 of the magnetic shield member 26 is bent radially inward of the valve body 11, thereby forming the second bent portion 30. In this way, the solenoid 10 is completed.

Thereafter, the solenoid 10 and the mating connector 23 are electrically connected by fitting the mating connector 23 into the opening 20 of the connector housing 18.

(Functions and Effects of Embodiment)

Next, functions and effects of this embodiment are described. The solenoid 10 according to this embodiment is provided with the valve body 11 having a cylindrical shape extending along the front-rear direction, the device connector 16 including the leg portions 17 projecting outward from the side wall 14 of the valve body 11 and the connector housing 18 provided on the sides of the leg portions 17 opposite to the valve body 11 with the clearance 19 provided between the side wall 14 of the valve body 11 and the connector housing 18, and the magnetic shield member 26 made of metal, to be mounted outside the valve body 11 and having a tubular shape open on one end part, and the magnetic shield member 26 includes the avoidance recesses 27 recessed from the opening end 34 of the one end part to avoid interference with the leg portions 17, and the inserting portion 28 to be inserted into the clearance 19 between the side wall 14 of the valve body 11 and the connector housing 18.

According to the above configuration, the clearance 19 is provided between the valve body 11 and the connector housing 18 by the leg portions 17 projecting from the side wall 14 of the valve body 11. Since the inserting portion 28 of the magnetic shield member 26 is inserted into this clearance 19, the region of the valve body 11 covered by the magnetic shield member 26 is wider as compared to the case where the connector housing 18 is directly provided on the side wall 14 of the valve body 11. As a result, the magnetic field efficiency of the solenoid 10 can be improved.

Further, according to the above configuration, parts of the valve body 11 not covered by the magnetic shield member 26 are regions of the magnetic shield member 26 where the avoidance recesses 27 for avoiding interference with the leg portions 17 are provided. As a result, the parts not covered by the magnetic shield member 26 can be made smaller as compared to the case where the connector housing 18 is directly provided on the side wall 14 of the valve body 11, wherefore the magnetic field efficiency of the solenoid 10 can be improved.

Further, according to this embodiment, the valve body 11 includes the front wall 12 located on a front side and the rear wall 13 located on a rear side with respect to the front-rear direction, the magnetic shield member 26 includes the front shield portion 31 extending along the front wall 12 of the valve body 11 and the side shield portion 32 extending along the side wall 14 of the valve body 11, the first bent portion 29 is bent along the rear wall 13 and connected to the side shield portion 32, and the end part of the inserting portion 28 is formed into the second bent portion 30 bent along the rear wall 13.

According to the above configuration, the rear wall 13 of the valve body 11 is at least partially covered by the first and second bent portions 29, 30. Since the front shield portion 31, the side shield portion 32, the first bent portion 29 and the second bent portion 30 of the magnetic shield member 26 are electromagnetically connected, the magnetic field efficiency of the solenoid 10 can be further improved.

The plurality of terminals 21 are disposed in the connector housing 18, and connected to the valve body 11 while being disposed inside the leg portions 17.

According to the above configuration, the valve body 11 and the device connector 16 can be electrically connected with the plurality of terminals 21 electrically insulated.

Further, according to this embodiment, the plurality of terminals 21 and the lock portion 24 for locking the mating connector 23 are disposed side by side along the outer peripheral surface of the side wall 14 of the valve body 11 in the connector housing 18.

According to the above configuration, a locking portion of the device connector 16 and the mating connector 23 is disposed side by side with the plurality of terminals 21 along the outer peripheral surface of the side wall 14 of the valve body 11, wherefore a height can be reduced as compared to the case where the lock portion 24 is provided above the terminals 21.

Second Embodiment

Figure 9:
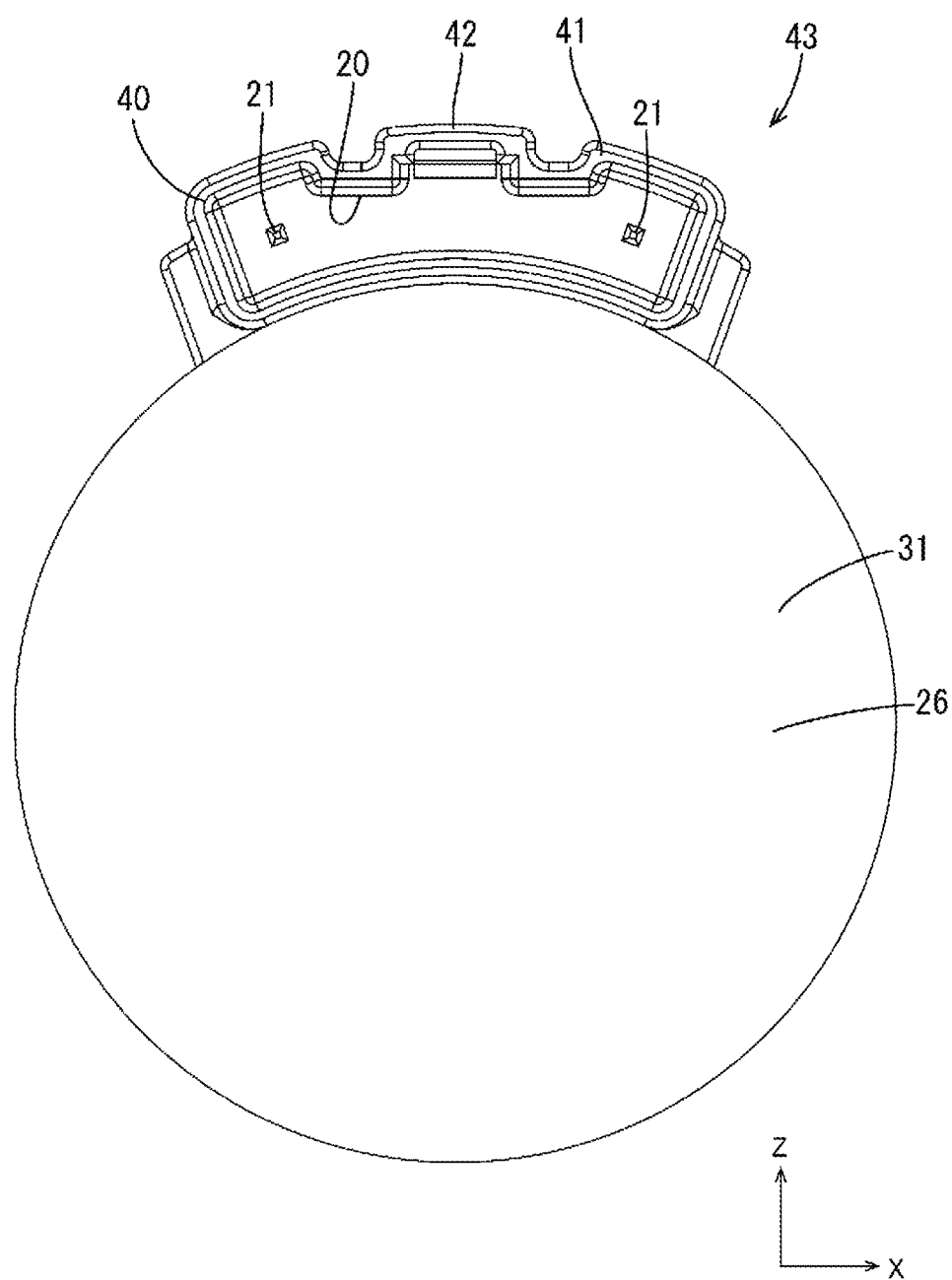
FIG. 9 is a front view showing a solenoid according to a second embodiment.
Figure 10:
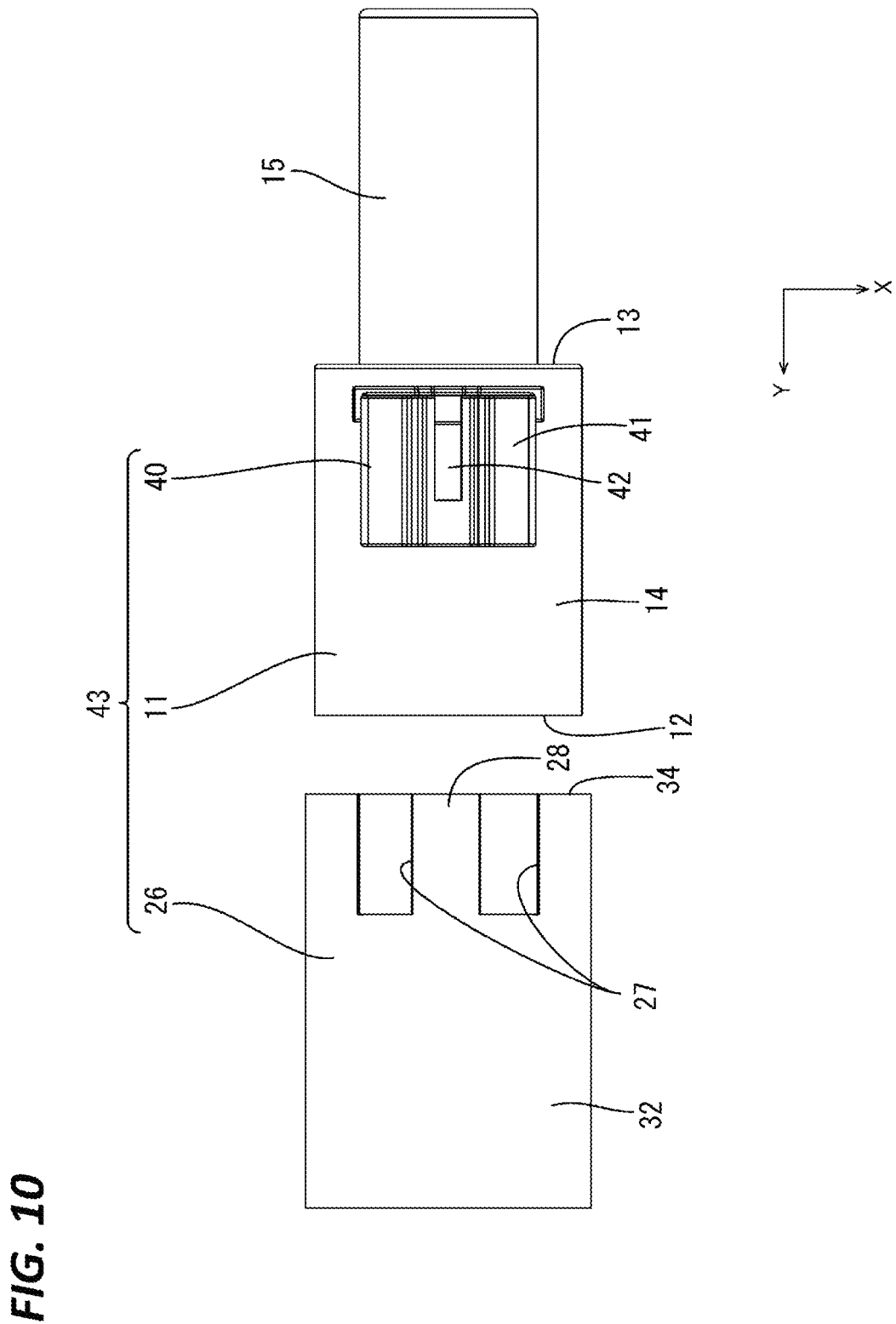
FIG. 10 is an exploded plan view showing the solenoid.
Figure 11:
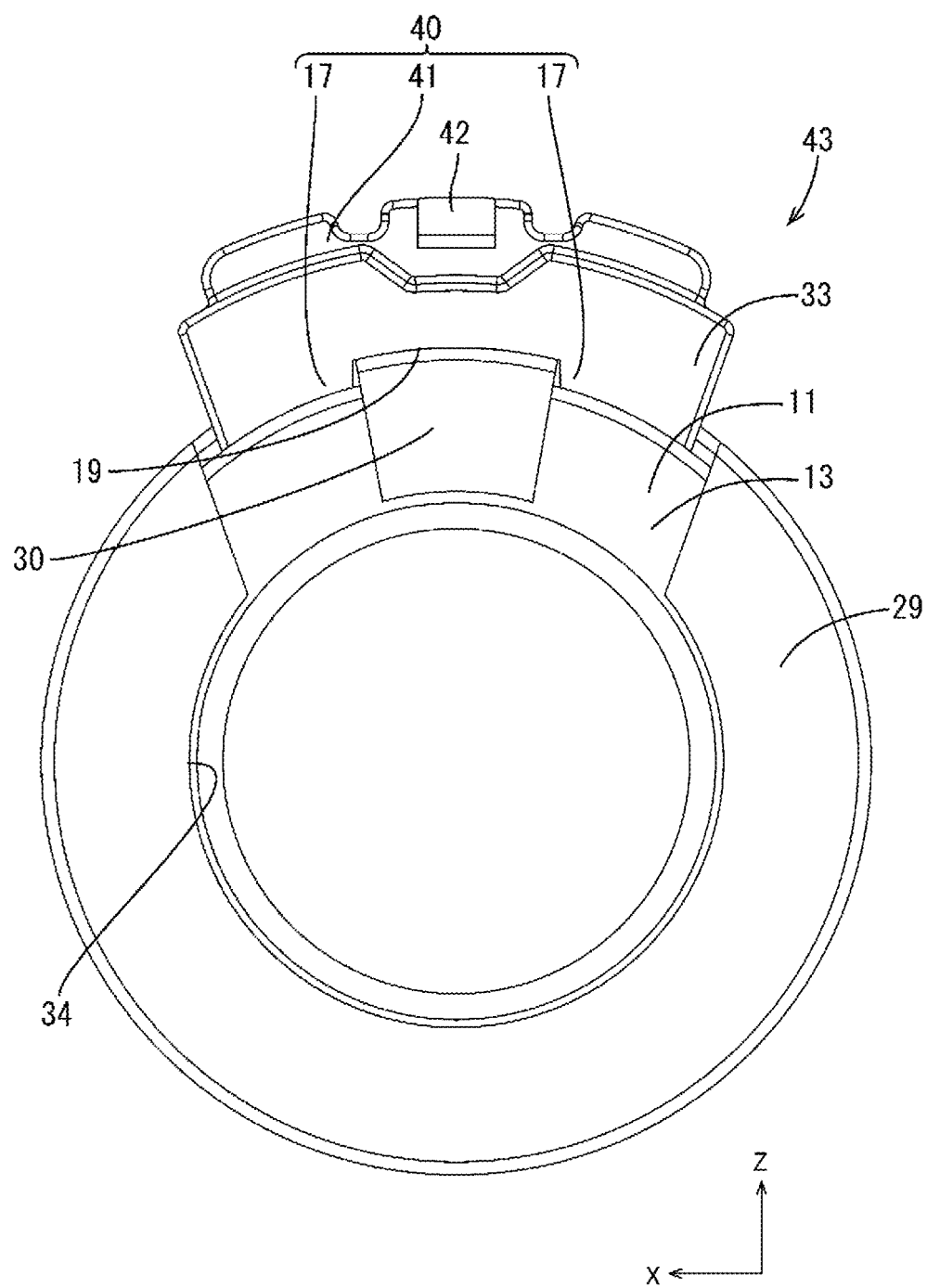
FIG. 11 is a back view showing the solenoid.

Next, a second embodiment of the technique disclosed in this specification is described with reference to FIGS. 9 to 11. In a device connector 40 provided in a solenoid 43 according to this embodiment, a lock portion 42 to be engaged with a lock receiving portion of an unillustrated mating connector is provided near a lateral center position in an upper part of a connector housing 41. In this way, the lock portion 42 is disposed between two terminals 21.

Since the configuration other than the above is substantially the same as in the first embodiment, the same members are denoted by the same reference signs and repeated description is omitted.

In this embodiment, the lock portion 42 is made of insulating synthetic resin and disposed between the plurality of terminals 21.

Since the insulating lock portion 42 is disposed between the terminals 21 according to the above configuration, a short circuit can be more reliably prevented while a clearance between the terminals 21 is effectively utilized.

Third Embodiment

Figure 12:
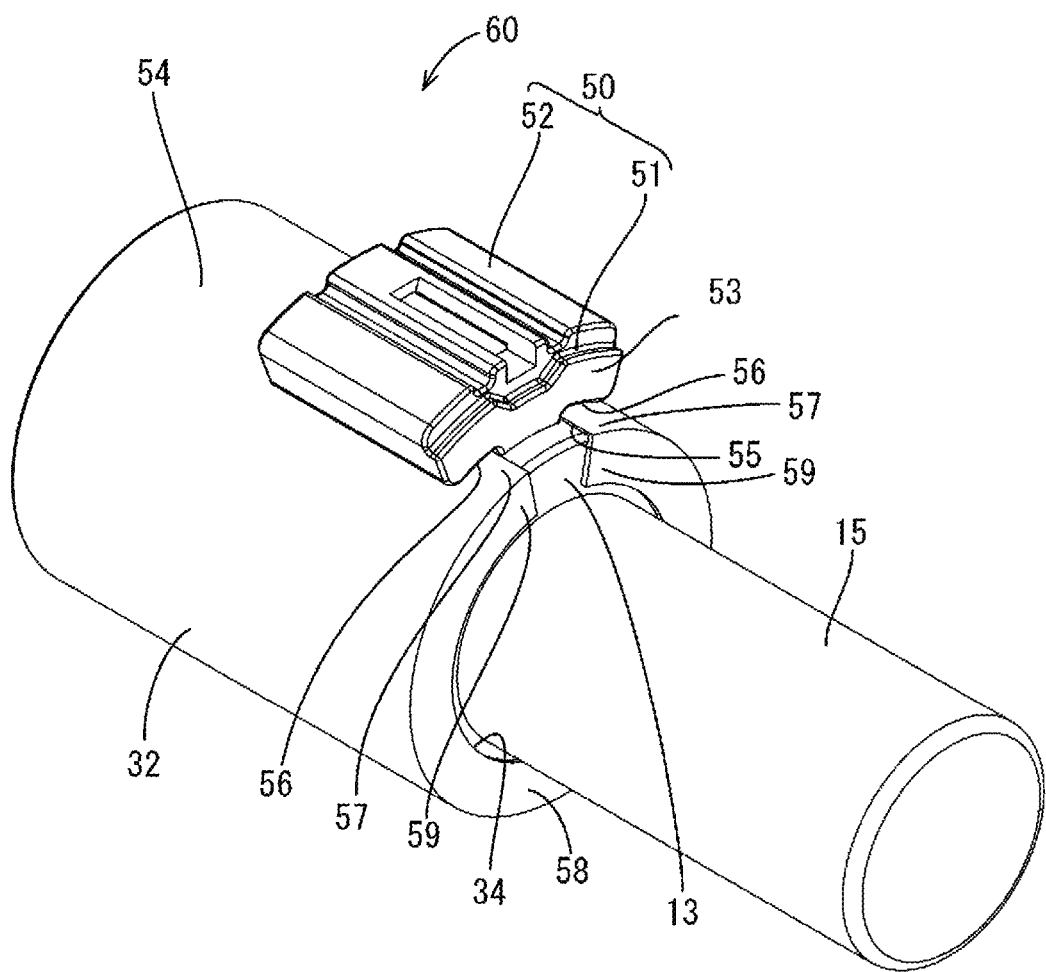
FIG. 12 is a perspective view showing a solenoid according to a third embodiment.
Figure 13:
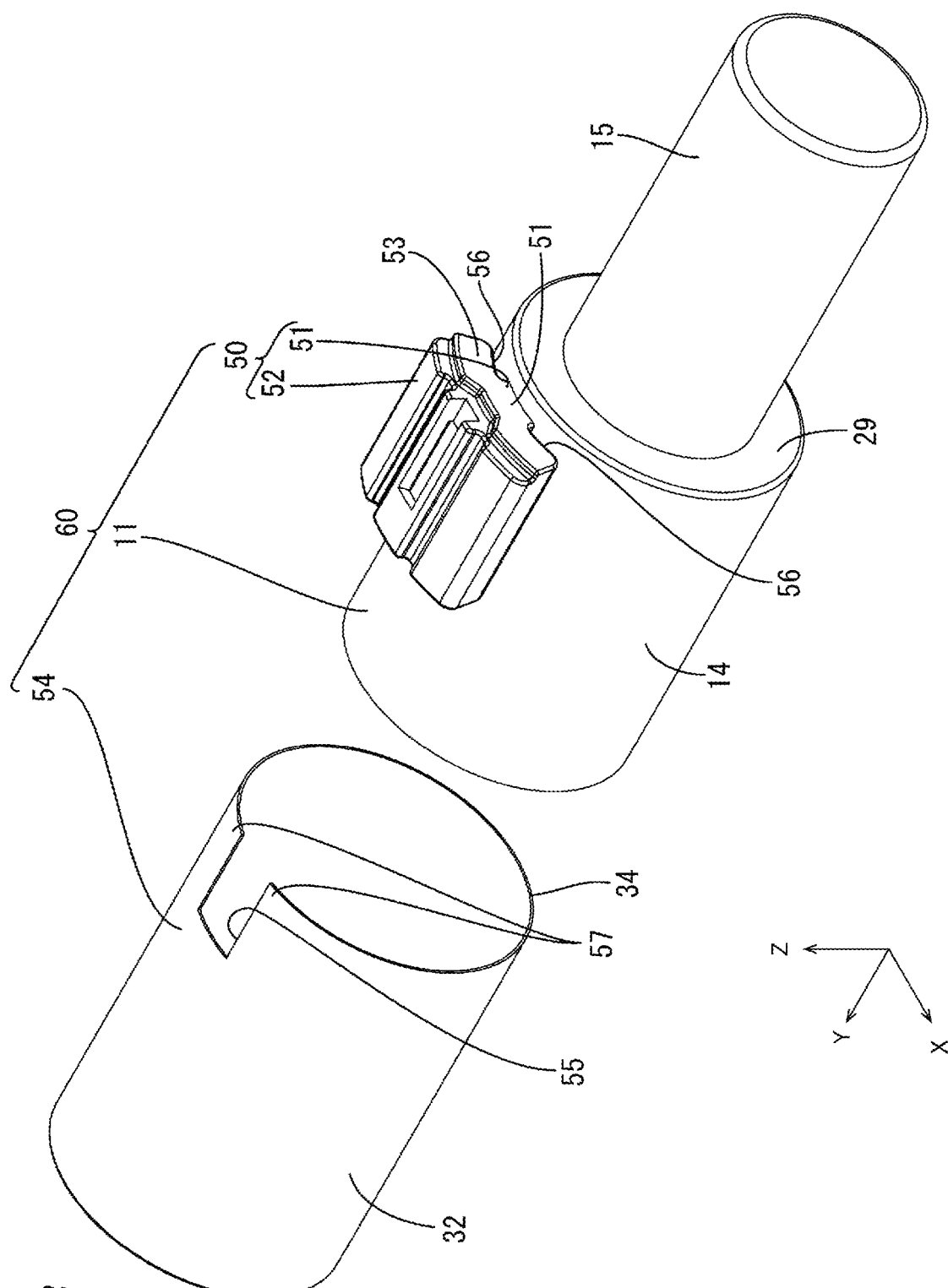
FIG. 13 is an exploded perspective view showing the solenoid.
Figure 14:
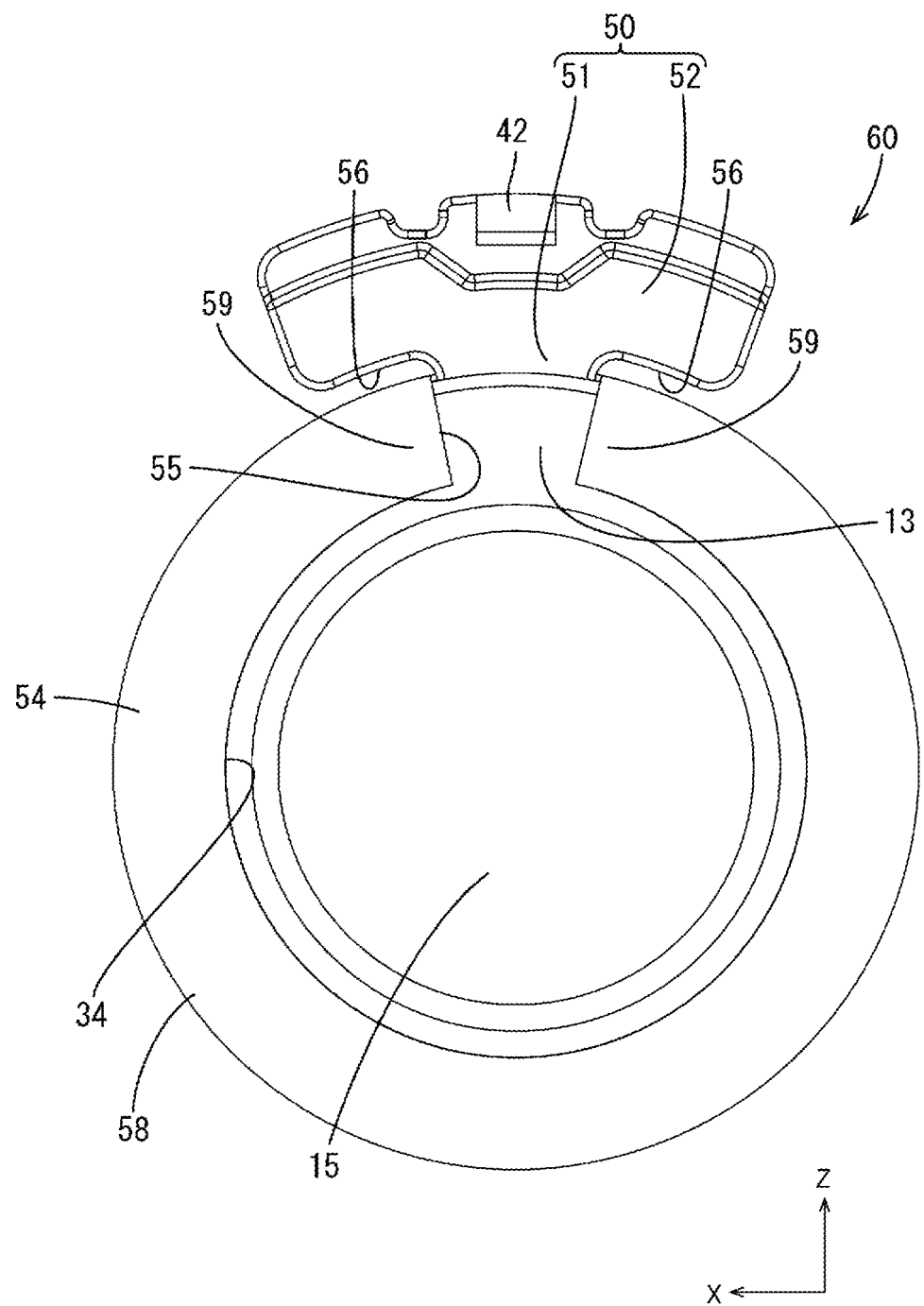
FIG. 14 is a back view showing the solenoid.

Next, a third embodiment of the technique disclosed in this specification is described with reference to FIGS. 12 to 14. A device connector 50 according to this embodiment includes one leg portion 51. The leg portion 51 projects upward from a side wall 14 of a valve body 11. A connector housing 52 is integrally provided to the leg portion 51 on an end part of the leg portion 51 opposite to the valve body 11. The leg portion 51 is provided near a center position of the connector housing 52 in a lateral direction.

Two terminals 21 are disposed in the connector housing 52. Although not particularly shown, the two terminals 21 are bent toward the leg portion 51 while being embedded in a rear wall 53 of the connector housing 52. The two terminals 21 are embedded inside the leg portion 51. An insulating synthetic resin constituting the connector housing 52 and the leg portion 51 is interposed between the two terminals 21 inside the leg portion 51. In this way, the terminals 21 in the leg portion 51 are electrically insulated.

One avoidance recess 55 concave forward is formed in a rear end part of a magnetic shield member 54. The leg portion 51 is located inside the avoidance recess 55 with the magnetic shield member 54 externally fit on the valve body 11. In this way, the interference of the leg portion 51 and the magnetic shield member 54 is suppressed.

Parts of the magnetic shield member 54 on both left and right sides of the avoidance recess 55 serve as inserting portions 57 to be inserted into clearances 56 formed between the connector housing 52 and the side wall 14 of the solenoid 10. The magnetic shield member 54 of this embodiment is formed with two inserting portions 57.

The side wall 14 of the valve body 11 is covered by the magnetic shield member 54 except in a region corresponding to the avoidance recess 55 of the magnetic shield member 54. Further, a rear wall 13 of the valve body 11 is covered by a first bent portion 58 and second bent portions 59.

Since the configuration other than the above is substantially the same as in the first embodiment, the same members are denoted by the same reference signs and repeated description is omitted.

According to the above configuration, the device connector 50 is coupled to the valve body 11 by one leg portion 51. In this way, it is sufficient to provide the magnetic shield member 54 with one avoidance recess 55. Since a part of the side wall 14 of the valve body 11 exposed by the avoidance recess 55 can be made smaller in this way, the magnetic field efficiency of a solenoid 60 can be improved.

Other Embodiments

The technique disclosed in this specification is not limited to the above described and illustrated embodiments. For example, the following embodiments are also included in the technical scope of the technique disclosed in this specification.

(1) Although the device connector 16, 40 includes two leg portions 17 in the first and second embodiments and the device connector 50 includes one leg portion 51 in the third embodiment, there is no limitation to this and a device connector may include three or more leg portions.

(2) Although the device connector 16, 40, 50 includes two terminals 21 in the first, second and third embodiments, there is no limitation to this and a device connector may include one terminal or three or more terminals.

(3) Although the lock portion 24, 42 is disposed along the side wall 14 of the valve body 11 in the first, second and third embodiments, there is no limitation to this and a lock portion may be formed above terminal(s).

(4) Although the tab-like terminals 21 are disposed in the device connector 16, 40, 50 and the female terminals are disposed in the mating connector 23 in the first, second and third embodiments, there is no limitation to this and female terminal(s) may be disposed in a device connector and tab-like terminal(s) may be disposed in a mating connector.

LIST OF REFERENCE NUMERALS 10, 43, 60: solenoid
11: valve body
12: front wall
13: rear wall
14: side wall
16, 40, 50: device connector
17, 51: leg portion
18, 41, 52: connector housing
21: terminal
23: mating connector
24, 42: lock portion
26, 54: magnetic shield member
27, 55: avoidance recess
28, 57: inserting portion
29, 58: first bent portion
30, 59: second bent portion
31: front shield portion
32: side shield portion
34: opening end

What is claimed is:
1. A device with connector, comprising:
a device having a cylindrical shape extending along an axial direction;

a device connector including a leg portion projecting outward from a side wall of the device and a connector housing provided on a side of the leg portion opposite to the device with a clearance provided between the side wall of the device and the connector housing; and a magnetic shield member made of metal, to be mounted outside the device and having a tubular shape open on one end part, the magnetic shield member including an avoidance recess formed into a concave shape from an opening end of the one end part to avoid interference with the leg portion and an inserting portion to be inserted into the clearance between the side wall of the device and the connector housing.

2. The device with connector of claim 1, wherein:

the device includes a front wall located on a front side and a rear wall located on a rear side with respect to the axial direction, the magnetic shield member includes a front shield portion extending along the front wall of the device and a side shield portion extending along the side wall of the device, an end part of the side shield portion is formed into a first bent portion bent along the rear wall and connected to the side shield portion, and an end part of the inserting portion is formed into a second bent portion bent along the rear wall.

3. The device with connector of claim 1, wherein a plurality of terminals are disposed in the connector housing and connected to the device while being disposed inside the leg portion.

4. The device with connector of claim 1, wherein a plurality of terminals and a lock portion for locking a mating connector are disposed side by side along an outer peripheral surface of the side wall of the device in the connector housing.

5. The device with connector of claim 4, wherein the lock portion is made of insulating synthetic resin and disposed between the plurality of terminals.

* * * * *